(12) United States Patent
Welch et al.

(10) Patent No.: US 6,987,466 B1
(45) Date of Patent: Jan. 17, 2006

(54) KEYBOARD HAVING A LIGHTING SYSTEM

(75) Inventors: Harold Welch, San Jose, CA (US);
Wing Kong Low, Cupertino, CA (US);
Benjamin Lyon, Pittsburgh, PA (US);
Duncan Kerr, San Francisco, CA (US);
Thai La, San Jose, CA (US); Brian Berkeley, Saratoga, CA (US)

(73) Assignee: Apple Computer, Inc., Cupertino, CA (US)

( * ) Notice: Subject to any disclaimer, the term of this patent is extended or adjusted under 35 U.S.C. 154(b) by 452 days.

(21) Appl. No.: 10/095,349

(22) Filed: Mar. 8, 2002

(51) Int. Cl.
*H03K 17/94* (2006.01)
*H03M 11/00* (2006.01)

(52) U.S. Cl. .......................... 341/22; 200/313; 362/84
(58) Field of Classification Search ................ 341/22; 200/310, 313, 314; 345/168; 362/84, 85, 362/558
See application file for complete search history.

(56) References Cited

U.S. PATENT DOCUMENTS

| | | | |
|---|---|---|---|
| 4,060,703 A * | 11/1977 | Everett, Jr. ................ | 200/5 A |
| 4,322,997 A | 4/1982 | Anstis | |
| 4,365,120 A | 12/1982 | Pounds | |
| 4,433,225 A | 2/1984 | Cowles | |
| 5,266,949 A | 11/1993 | Rossi | |
| 5,868,487 A | 2/1999 | Polley et al. | |
| 6,179,432 B1 | 1/2001 | Zhang et al. | |
| 6,191,939 B1 | 2/2001 | Burnett | |
| 6,199,996 B1 | 3/2001 | Katrinecz, Jr. et al. | |
| 6,369,801 B2 * | 4/2002 | Boireau et al. ............. | 345/169 |
| 6,747,402 B2 * | 6/2004 | Hato et al. .................. | 313/305 |
| 6,764,191 B2 * | 7/2004 | Douzono et al. ............ | 362/84 |
| 2003/0103359 A1 * | 6/2003 | Chiang et al. .............. | 362/558 |

* cited by examiner

*Primary Examiner*—Timothy Edwards, Jr.
(74) *Attorney, Agent, or Firm*—Blakely, Sokoloff, Taylor & Zafman LLP

(57) ABSTRACT

A keyboard and methods of making the same. The keyboard comprises of a bottom conducting base plate, an illumination layer, a transparent top conducting layer, a light transmissive keyboard membrane, and a plurality of input keys. The illumination layer is deposited on the bottom conducting base plate. The transparent top conducting layer is deposited on the illumination layer. The light transmissive keyboard membrane is disposed on the transparent top conducting layer. And, the plurality of input keys is disposed on the light transmissive keyboard membrane wherein each of the plurality of input keys has a keyswitch mechanism and a keycap including an upper strike surface attached to the keyswitch mechanism.

37 Claims, 13 Drawing Sheets

US 6,987,466 B1

KEYBOARD HAVING A LIGHTING SYSTEM

BACKGROUND OF THE INVENTION

The present invention relates to methods and apparatuses for making a keyboard having a lighting system. The keyboard having the lighting system can be used in conjunction with a computer system.

A keyboard is commonly used in conjunction with a computer as an input device. Keyboards usually have a plurality of keycaps wherein alphanumeric symbols (or symbols in foreign languages) are printed on the keycaps to help users select the desired input to the computer. Under normal condition, such as under a brightly lit environment, the users typically have no difficulty using the keyboard since the symbols on the keycaps can be seen easily. However, in a dark environment or in a low ambient light condition, users are unable to see the symbols on the keycaps clearly or unable to see the symbols at all.

Various methods exist in the prior art for illuminating keyboards. For example, U.S. Pat. No. 6,179,432 by Zhang et al, contemplates a keyboard having an illumination panel inserted within the keyboard. The illumination panel in the keyboard in Zhang's patent is placed between the keycaps and metal plate of the keyboard. Such an integration of the illumination panel requires reconfiguration of the keyboard which ultimately impacts the thickness of the keyboard. For example, integrating the illumination panel into the keyboard by placing the illumination panel between the keycaps and the metal plate of the keyboard decreases the key travel of the keyboard, which can be referred to as the downward travel distance for each key in the keyboard. In order to maintain the same key travel, the keyswitch mechanism in the keyboard has to be re-designed and as such, will result in an increase in the overall thickness of the keyboard.

SUMMARY OF THE INVENTION

The present invention discloses a keyboard having a lighting system and methods of making the same.

In one exemplary embodiment, a keyboard comprising a bottom conducting base plate, an illumination layer, a transparent top conducting layer, a light transmissive keyboard membrane, and a plurality of input keys is described. The illumination layer is deposited on the bottom conducting base plate. The transparent top conducting layer is deposited on the illumination layer. The light transmissive keyboard membrane is disposed on the transparent top conducting layer. And, the plurality of input keys is disposed on the light transmissive keyboard membrane wherein each of the plurality of input keys has a keyswitch mechanism and a keycap including an upper strike surface attached to the keyswitch mechanism.

In another exemplary embodiment, a keyboard comprising an illumination panel, a keyboard base plate, a light transmissive keyboard membrane, and a plurality of input keys is described. The illumination panel emits light upon an application of a power source. The keyboard base plate is disposed on top of the illumination panel. The keyboard base plate has a plurality of holes forming therethrough. The light transmissive keyboard membrane is disposed on the keyboard base plate. The plurality of input keys is disposed on the light transmissive keyboard membrane and extended from the keyboard base plate. Each of the plurality of input keys has a keyswitch mechanism and a keycap including an upper strike surface attached to the keyswitch mechanism. And, the plurality of holes directing illuminations to the plurality of input keys.

BRIEF DESCRIPTION OF THE DRAWINGS

The present invention is illustrated by way of example and not limitation in the figures of the accompanying drawings.

DETAILED DESCRIPTION OF THE INVENTION

Figures 1A, 1B:
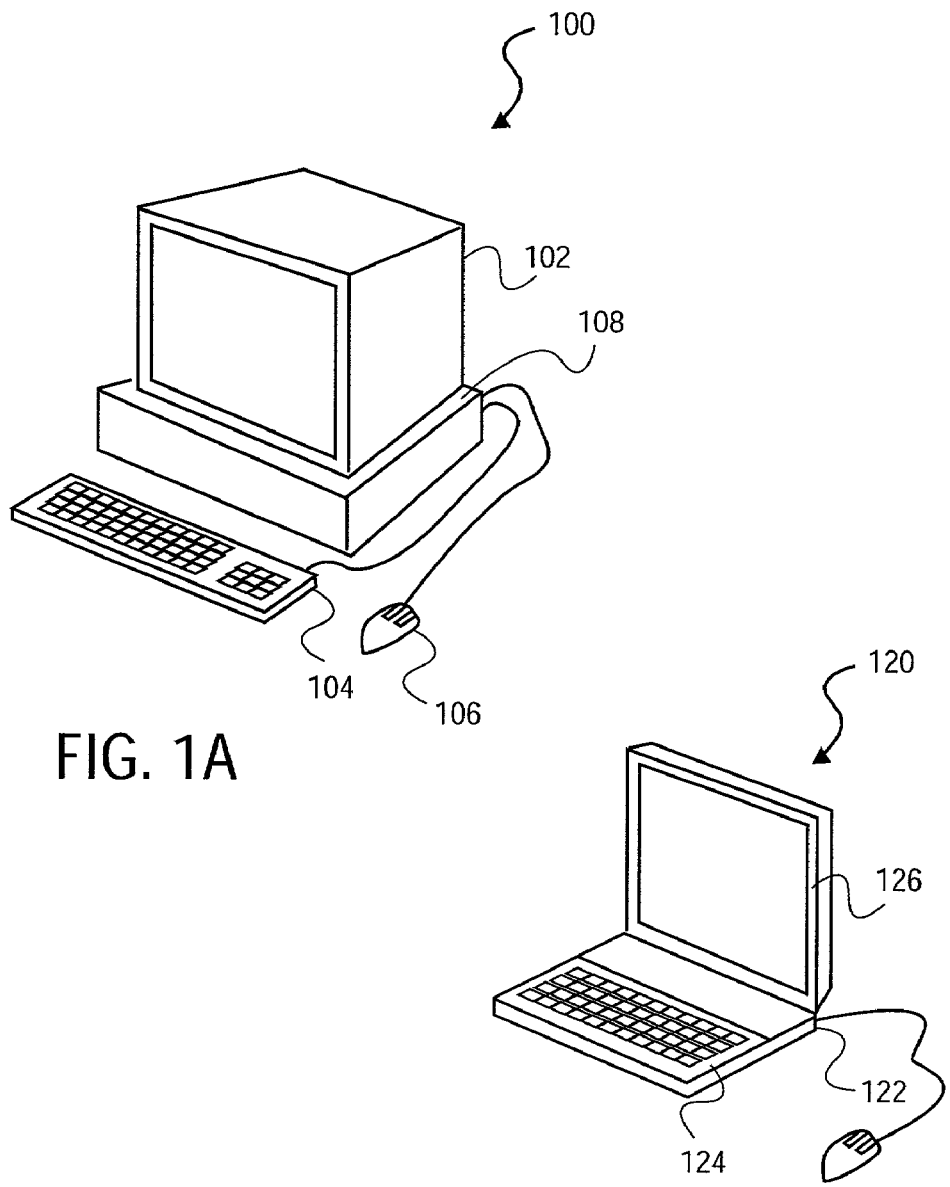
FIG. 1A illustrates an exemplary computer system that may incorporate a keyboard made in accordance to the present invention.
FIG. 1B illustrates an exemplary notebook type computer system that may incorporate a keyboard made in accordance to the present invention.

The subject invention will be described with reference to numerous details set forth below, and the accompanying drawings will illustrate the invention. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail. In the drawings, the same element is labeled with the same reference numeral.

FIGS. 1A and 1B show examples of digital devices that may incorporate a keyboard made according the present invention. The examples shown in these figures are for illustration purposes and not meant to be a limitation of the application of the present invention. One such digital device is a computer system 100 illustrated in FIG. 1A, which is a desktop type personal computer having a monitor or display 102, keyboard 104 and a mouse 106 that provides a system for permitting a user to interact with the computer system 100. The keyboard 104, the display 102, and the mouse 106 are connected to a central computer module 108. The central computer module 108 typically houses a hard drive and a microprocessor (not shown) which controls the operation of the computer system 100. Other features that may vary the configuration of the computer system 100 are often available, but the keyboard 104 can be adapted for any of these configurations.

Another example of such digital device is a computer system 120 illustrated in FIG. 1B. The computer system 120 is a notebook type personal computer system. As illustrated, a keyboard 124 is incorporated into the computer system 120 into an outer housing 122 of the computer system 120. The computer system 120 also includes a display 126, and optionally, a mouse 128. The outer housing 122 houses a central computer module that typically includes, for instance, a hard drive and microprocessor (not shown) that control the operation of the computer system 120.

Figure 1C:
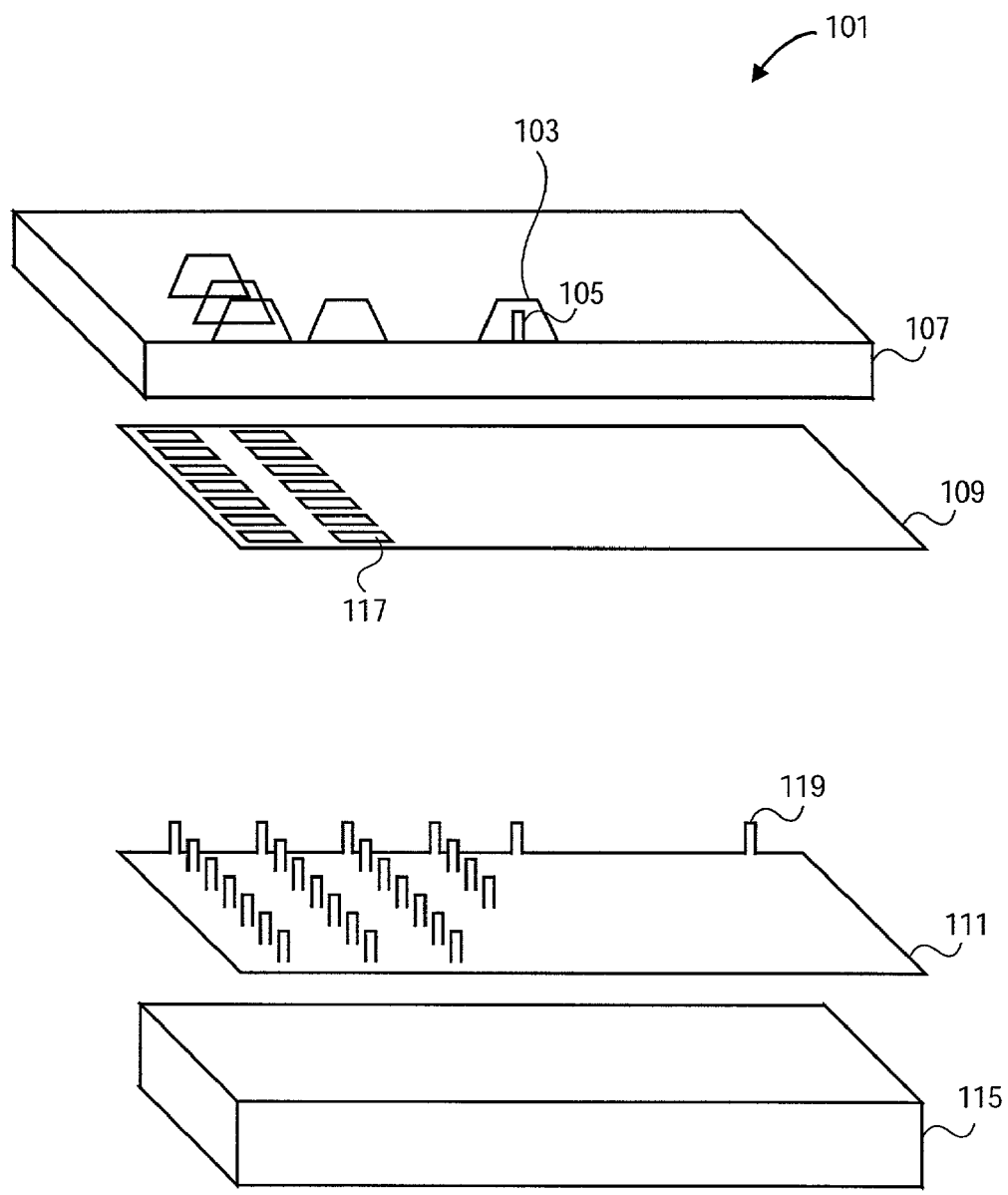
FIG. 1C illustrates an exemplary typical keyboard.

FIG. 1C illustrates that typically, a keyboard 101 is comprised of keycap 103, keystems 105, a keyboard top cover cover 107, a keyframe 109, a circuit board 111 with key spring switches 119 and a key board bottom cover cover 115. The keystems 105 are inserted through holes 117 in the keyframe 109. The holes 117 in the keyframe 109 are aligned with key spring switches 119 of the circuit board 111. The circuit board 111 is secured to keyboard bottom cover 115. The keyboard top cover 107 fits over or otherwise attaches to the keyboard bottom cover 115, and thereby provides enclosure for the keyboard.

Figure 1D:
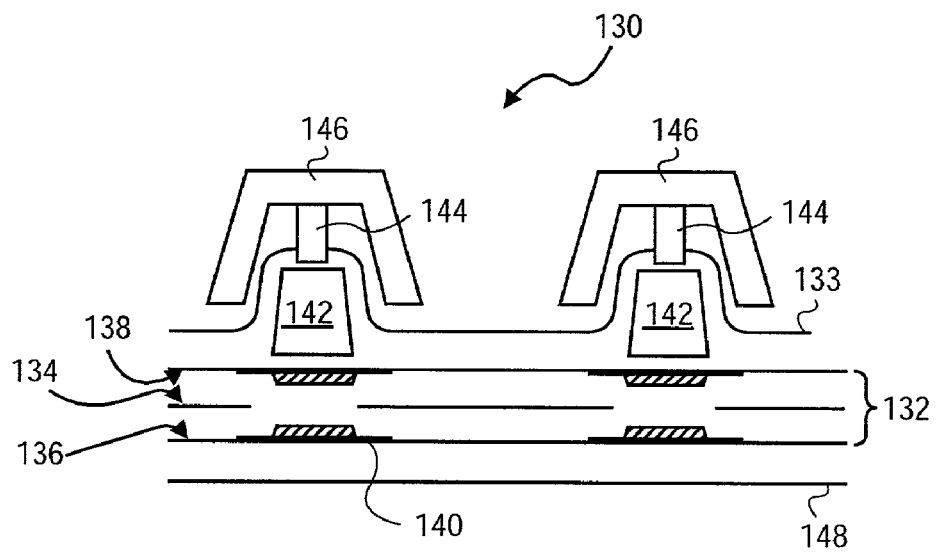
FIG. 1D illustrates an exemplary keyboard for a desktop type of computer.

FIG. 1D illustrates an example of a keyboard that can be used for the desktop type of computer, a keyboard 130. The keyboard 130 includes a membrane 132, a keyframe 133, a plurality of rubber domes 142, a plurality of plungers 144, and a plurality of keycaps 146. The membrane 132 are composed of three sheets, a top layer 138, a bottom layer 136, and a spacer 134, which separates the top layer 138 from the bottom layer 136. The top layer 138 has conductive tracks (e.g., silver inks) 140 printed on it. The spacer 134 includes a plurality of holes in it. The bottom layer 136 also has conductive tracks 140 printed on it. When the keycap 146 is pressed, the plunger 144 attached to the keycap 146 pushes down on the rubber dome 142, which pushes the two conductive tracks 140 on the top layer 138 and the bottom layer 136 together through the hole to complete the circuit. The keyboard 130 may also include a support frame 148 for support purposes.

Figure 1E:
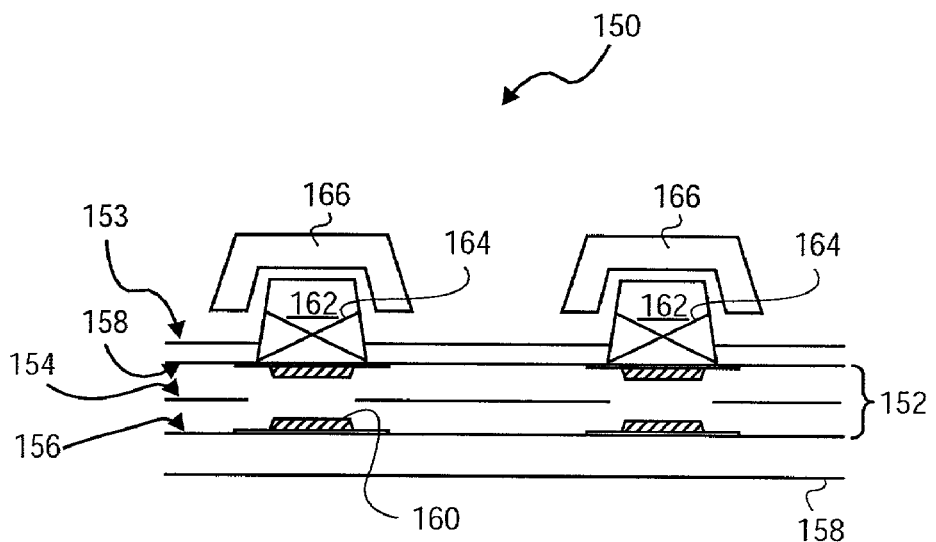
FIG. 1E illustrates an exemplary keyboard for a notebook type of computer.

Keyboards for a notebook type of computer as shown in FIG. 1B may require the keyboards to be thinner than those for a desktop type of computer shown in FIG. 1A. FIG. 1E illustrates an example of a keyboard that can be used for the notebook type of computer, a keyboard 150. The keyboard 150 includes a membrane 152, a keyframe 153, a plurality of rubber domes 162, a plurality of keyswitch mechanism (actuators) 164, and a plurality of keycaps 156. The membrane 152 are composed of three sheets, a top layer 158, a bottom layer 156, and a spacer 154, which separates the top layer 158 from the bottom layer 156. The top layer 158 has conductive tracks (e.g., silver inks) 160 printed on it. The spacer 154 includes a plurality of holes in it. The bottom layer 156 also has conductive tracks 160 printed on it. When the keycap 166 is pressed, the rubber dome 162 within the keycap support mechanism 164 is depressed, and when nearing the end of the stroke, the two conductive tracks 160 on the top layer 158 and the bottom layer 156 are pressed together to complete the circuit. The keyboard 150 may also include a support frame 158 for support purposes.

Figure 2:
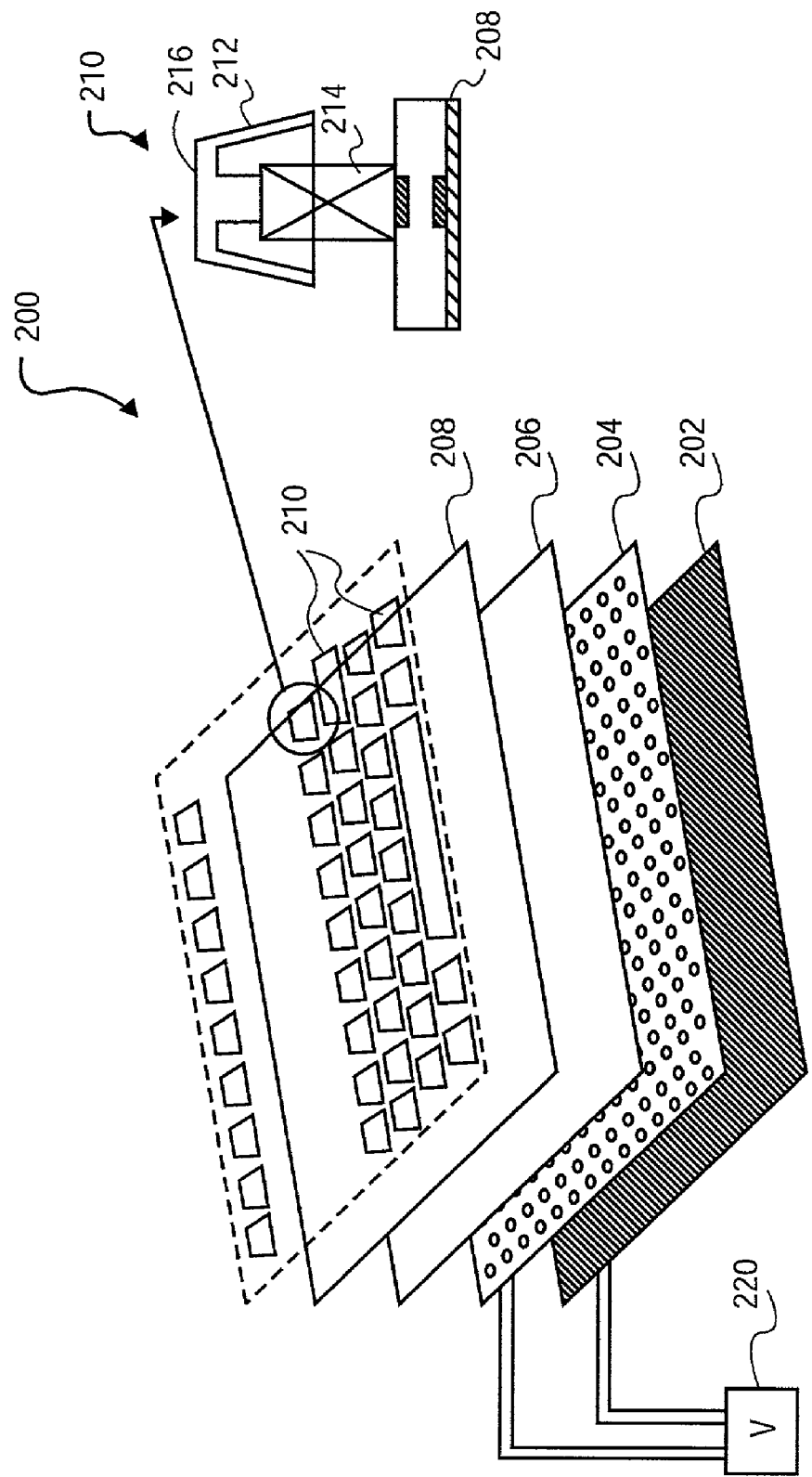
FIG. 2 illustrates a perspective view of an exemplary keyboard according to an exemplary embodiment of the present invention.

FIG. 2 illustrates a preferred embodiment of the present invention. A keyboard 200 is shown to comprise a bottom conducting base plate 202, an illumination layer 204, a top conducting layer 206, a light transmissive keyboard membrane 208, and a plurality of input keys 210.

In the preferred embodiment, the illumination layer 204 is an electroluminescent layer. The bottom conducting base plate 202 is made out of a conductive material (e.g., metal, aluminum, copper, silver, etc) such that it functions as an electrode for illumination layer 204. The bottom conducting base plate 202 serves at least three purposes for the present embodiment, as a mechanical support for the keyboard 200, as a grounded conductor for the illumination layer 204, and also as a metallic reflector for the illumination layer 204. The bottom conducting base plate 202 of the present invention is distinct from the keyboard bottom cover 115 of the typical keyboard 101 in that the bottom conducting base plate 202 is a conductor for the illumination layer 204. Additionally, the bottom conducting base plate 202 is also the base to which the input keys 210 are anchored. The bottom conducting base plate 202 may include a plurality of tabs (not shown) to which the input keys 210 are secured.

The illumination layer 204 is on top of the bottom conducting base plate 202. The illumination layer 204 comprises of an illumination material that emits light upon an application of a voltage source. The illumination layer 204 further comprises light emitting phosphors and a thin layer of transparent dielectric layer to protect the phosphors (not shown). Examples of the light emitting phosphors include copper or manganese doped zinc sulfide. The phosphors glow when subjected to a high alternating voltage field. The phosphors can be deposited by a sputter deposition process.

The top conducting layer 206 is deposited on top of the illumination layer 204. The top conducting layer 206 is transparent and which, can be made out of indium tin oxide (ITO) such that the illumination layer 204 can illuminate light through the top conducting layer 206.

Figure 5:
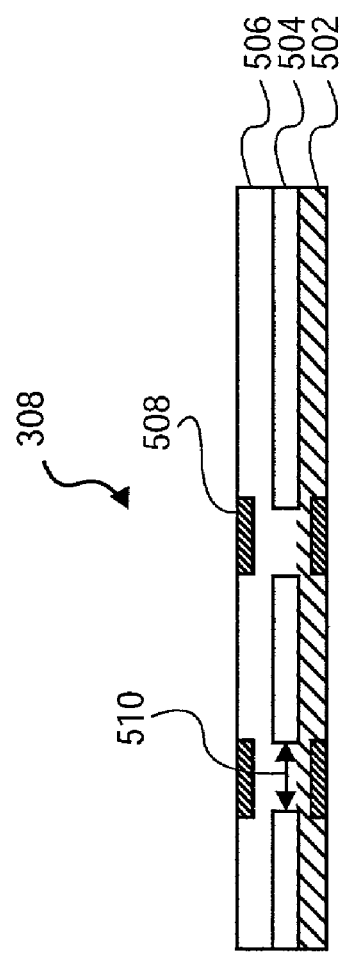
FIG. 5 illustrates an exemplary membrane sheet of an exemplary keyboard of the present invention.

The light transmissive keyboard membrane 208 is deposited on the top conducting layer 206. The light transmissive keyboard membrane 208 typically comprises of a spacer layer sandwiched by a top layer and a bottom layer. The top layer and the bottom layer are both made out of a plastic material. The top layer and the bottom layer typically include circuits such as printed silver ink and the spacer layer includes holes through which pads in the circuit from the top and the bottom layer may contact to close the switch for each of the keys in the keyboard when said keys are pressed. The keyboard membrane 208 can be seen in more details in FIG. 5 which illustrates that spacer layer 504 having holes 510 is sandwiched between bottom layer 502 and top layer 506.

The input keys 210 of FIG. 2 may be arranged in a variety of patterns along the keyboard membrane 208. The input keys 210 are typically arranged in conventional patterns of alphanumeric and other symbols, as found with most personal computers, to guide the user in providing appropriate input via the keyboard 200.

Each of the input keys 210 preferably includes a key actuator 214 mounted to the keyboard membrane 208, and a keycap 212 mounted to a corresponding key actuator 214, as is known to those of ordinary skill in the art. Each of the keycaps 212 preferably includes an upper strike surface 216. The user typically pushes the upper strike surface 216 to provide input to a device such as the computer system 100 and 120. Typically, one or more alphanumeric or other symbols are visible at a corresponding strike surface 216 to guide the user in pressing the appropriate input keys 210. The key actuators 214 cooperate with appropriate output circuitry, as is well known to those of ordinary skill in the art, to provide corresponding output signals to the computer system, via communication link (not shown). The output signals correspond to the particular input key or keys 210 pressed by the user.

In a preferred embodiment, to facilitate illumination of the keyboard 200, and specifically input keys 210, at least part of each keycap 212 comprises a light transfer portion to permit passage of light therethrough from the illumination layer 204. The light transfer portion can be the entire keycap 212 or just the portions where the symbols are located. In one example, the keycaps 212 are made out of a translucent material or a light transmissive material. Transparent ABS plastic is an example of such material. In this case, the light transfer portion defines the entire keycap 212. In another example, the outer surface of translucent keycaps 212 are made out of an opaque material and the light transfer portion of this opaque material is etched so that it transmits light. The etched portion can be patterned to define the symbols on each of the strike surface. Another potential arrangement includes placement of opaque symbols in the keycaps 212 which is formed of a translucent material to allow transmission of light around the symbols.

The keyboard 200 is also coupled to an alternating voltage source 220 for driving the illumination layer 204.

The keyboard 200 of the present invention integrates the electroluminescent material into the keyboard components. The light transmissive keyboard membrane and the bottom conducting plate are integral components of the illumination layer 204. The embodiments discussed above enable the keyboard to have a slim design. By using the preexisting membrane and back plate of the keyboard as components of an electroluminescent panel to illuminate the keyboard 200, the added thickness introduced by including the illumination panel in the keyboard 200 is minimal. Additionally, the design discussed in FIG. 2 combines the functionality of the three components and integrates them into one part that both provides the backlight and switching functionality as well as the mechanical support necessary for the moving part of the keyboard. This design reduces the minimum thickness to the screen printing tolerance for laying down the EL and the adhesive layers. Unlike the present invention, the conventional designs introduce a minimum of approximately 0.25 mm to the thickness of the keyboard because of the need for an electroluminescent substrate and electroluminescent rear conductor and/or reflector, in addition to the standard keyboard components.

Figure 3:
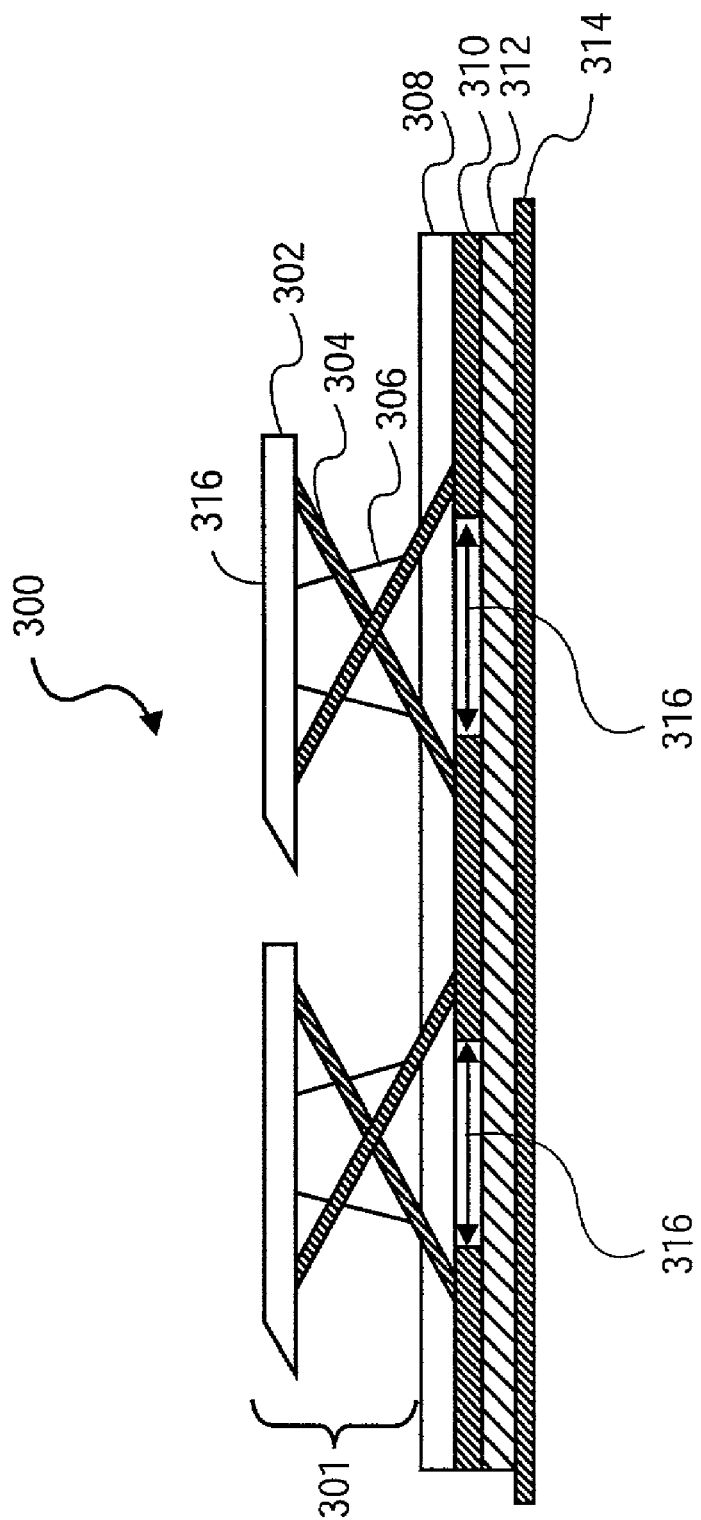
FIG. 3 illustrates a perspective view of another exemplary keyboard according to another exemplary embodiment of the present invention.

FIG. 3 illustrates another preferred embodiment of the present invention, a keyboard 300. In this preferred embodiment the keyboard 300 comprises of an illumination panel 312, a keyboard base plate 310, a keyboard membrane 308, and a plurality of input keys 301 extending from the keyboard base plate 310. The keyboard 300 optionally comprises of a stiffener support plate 314, which is disposed on the bottom of the illumination panel 312.

Figure 4:
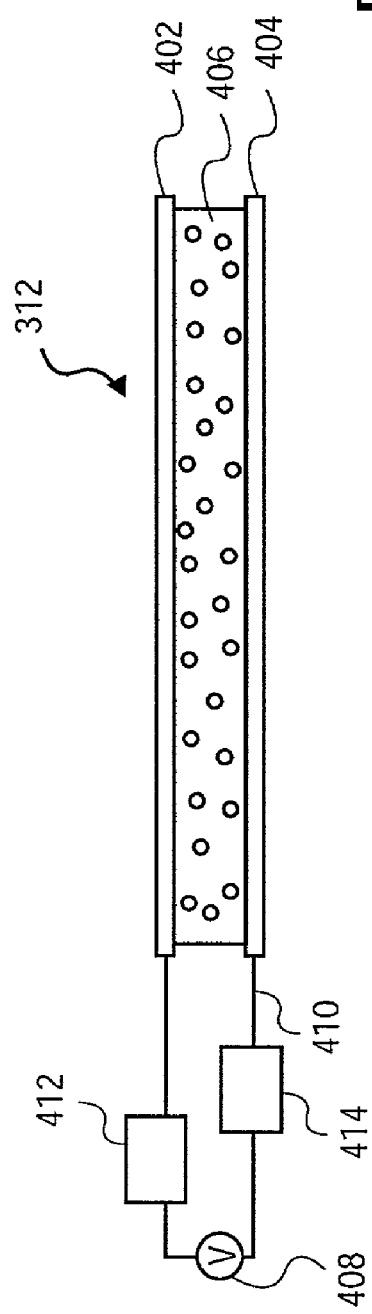
FIG. 4 illustrates an exemplary electroluminescent sheet that can be used for the present invention.

In one exemplary embodiment, the illumination panel 312 comprises of an electroluminescent sheet 312 which is further detailed FIG. 4. The electroluminescent sheet 312 comprises of an electroluminescent material 406 (e.g., phosphors) sandwiched between a two transparent electrode 402 and 404. When a power source 408 is applied to the conductive surfaces (e.g., the transparent electrode 402 and 404), the phosphors illuminate and light is emitted from the entire surface. The EL lamp is thin, flexible and can be twisted, bent or formed into any shape. These lamps draw very little power and produce very little heat. The power source 408 is supplied to the electroluminescent sheet 312 via electrical lead 410 which couples to the two transparent electrodes 402 and 404. In a preferred embodiment, only the upper conductive surface, the electrode 402, is an optically transmissive conductor. When leads 410 are connected to the power source 408, the entire sheet illuminates with an intensity that is substantially uniform across the entire surface of the electroluminescent panel 312.

In another embodiment, the electroluminescent sheet 312 is connected through the leads 410 to any convenient power source 408, which may be a battery or the power source of keyboard 300. Preferably, an inverter (not shown) is included with the power source to supply the relatively high alternating voltage required for the electroluminescent sheet 312. The intensity of light from the electroluminescent sheet 312 can be varied using an intensity control device 412 such as a rheostat in series with the power source 408, as illustrated in FIG. 4. In another embodiment, the intensity may be controlled by providing a photosensitive device 414, such as a photo-cell, and associated circuitry to control the intensity of the electroluminescent sheet 312 in response to the intensity of light in the environment in which keyboard 300 is used. The photosensitive device 414 may control the illumination of the keyboard 300 such that the keyboard 300 appears brighter in the dark and dimmer in the light. A variety of methods, devices, and circuitry for controlling the intensity of the electroluminescent sheet 312 will readily be recognized by persons of ordinary skill in the art.

In another example, an automatic sensor, such as a photo detector or a light sensor (not shown), is coupled to the power source 408 to further control the keyboard 300 illumination system. For instance, the sensor may detect that the environment that the keyboard 300 is residing in is a dark environment. Alternatively, the sensor may detect that the keyboard 300 is experiencing a reduced ambient light. In any event, the sensor sends a signal to a control system that automatically supplies a voltage to the electroluminescent sheet 312. When there is such a sensor, the keyboard 300 is automatically illuminated when the sensor detects the dark environment or the reduced ambient light. Additionally, when the sensor detects that the environment provides sufficient lighting to the keyboard 300, the sensor may send a signal to a control system of the computer. The signal may tell the control system to supply no voltage to the keyboard 300. Thus, the keyboard 300 will not be illuminated. The signal may also tell for the control system to turn off the voltage that illuminates the keyboard 300. Further yet, this turning on and off of the illumination of the keyboard 30 can be performed by the user choosing various command input using an input control device (e.g., a mouse or a keyboard).

Electroluminescent sheets are commercially available in a variety of colors such as white, yellow, blue and green. They may be cut to order by the manufacturer, who will provide electrical tabs connected to the conductive surfaces for connection to an electrical power source. For example, flexible electroluminescent sheets may be obtained from SEG Corporation, (2020 Went Avenue, Mishawaka, Ind. 46545), which has an Internet address of www.flashseg.com. Alternatively, flexible electroluminescent sheets may be obtained from Durel Corporation, (2225 W. Chandler Blvd., Chandler, Ariz. 85224-6155), which has Internet address of www.durel.com.

FIG. 3 illustrates that the keyboard base plate 310 is disposed on top of the illumination panel 312. The keyboard base plate 310 includes a plurality of holes 316 cutting therethrough to allow light from the electroluminescent layer to illuminate to the input keys 301.

In a typical keyboard, different layers in a keyboard does not have holes cutting therethrough except those holes that are necessary to allow the key switches (e.g., 105) to be inserted through and be anchored to a base plate of the keyboard. Thus, in conventional methods of illuminating a keyboard, an illumination panel needs to be disposed immediately below the keyswitch and above the base plate. Inserting the illumination panel between the keyswitch and the base plate of the keyboard increases the key travel of the keyboard. To maintain the same key travel, the keyswitch mechanism needs to be redesigned or be made larger, and, increasing the size of the keyswitch mechanism will increase the total thickness of the keyboard. In the present embodiment, the keyboard base plate 310 of the present embodiment includes a plurality of holes 316 through which the light from the electroluminescent layer 312 can shine. There is thus no need to reconfigure the current keyboard to integrate the illumination panel 312 of the present embodiment into a keyboard. The illumination panel 312 can be attached to the bottom of the conventional keyboard to illuminate the keyboard and the holes cutting therethrough in the bottom cover of the keyboard facilitates the transmittance of the light.

Disposed on the keyboard base plate 310 is the light transmissive keyboard membrane 308. The light transmissive keyboard membrane 308 is similar to the light transmissive keyboard membrane 208 described above. The keyboard membrane 308 can be seen in FIG. 5 which illustrates that spacer layer 504 having holes 510 is sandwiched between bottom layer 502 and top layer 506. The top layer 506 and the bottom layer 502 also have printed silver ink such that when the input keys 301 is pressed, the silver ink in each of the layers make contact, close the switch and cause an electrical signal corresponding to the key pressed.

The input keys 301 of FIG. 3 may be arranged in a variety of patterns along the keyboard membrane 308. The input keys 301 are typically arranged in conventional patterns of alphanumeric and other symbols, as found with most personal computers, to guide the user in providing appropriate input via the keyboard 300.

Each of the input keys 301 preferably includes a key actuator 304 mounted through the keyboard membrane 308 and to the keyboard base plate 310. The key actuator 304 is well known in the art. Each of the input key 301 also includes a keycap 302 and a key rubber dome 306 mounted to a corresponding key actuator 304, as is known to those of ordinary skill in the art. Each of the keycaps 302 includes an upper strike surface 316. The user typically contacts the upper strike surface 316 to provide input to a device such as the computer system 100 and 120 similar to the keyboard 200.

In a preferred embodiment, to facilitate illumination of the keyboard 300, and specifically input keys 301, at least part of each keycap 302 comprises a light transfer portion to permit passage of light therethrough from the illumination panel 312. The light transfer portion can be the entire keycap or just the portions where the symbols are located similar to the keycaps in keyboard 200 discussed above.

In a preferred embodiment, the keyboard 300 comprises a stiffener support plate 314. The support plate 314 provides a support to the plurality of input keys 301 as well as provides a flat plane for the input keys 301 to rest upon. This is especially useful when the keyboard 300 is incorporated into a notebook type of computer system. In a conventional notebook type computer, different components are assembled together in a tight and thin space. Not all of the components may have the same thickness and thus, the final surface is not necessarily flat. Thus, the support plate 314 will ensure that the input keys 301 are all well supported on a flat surface. The support plate 314 is made out of metal or other suitable material that is stiff and flexible. Note that the support plate 314 is not needed in the keyboard 300. When the notebook computer comprises of components that may provide a sufficient flat surface, the support plate 314 is not necessary.

Figure 6:
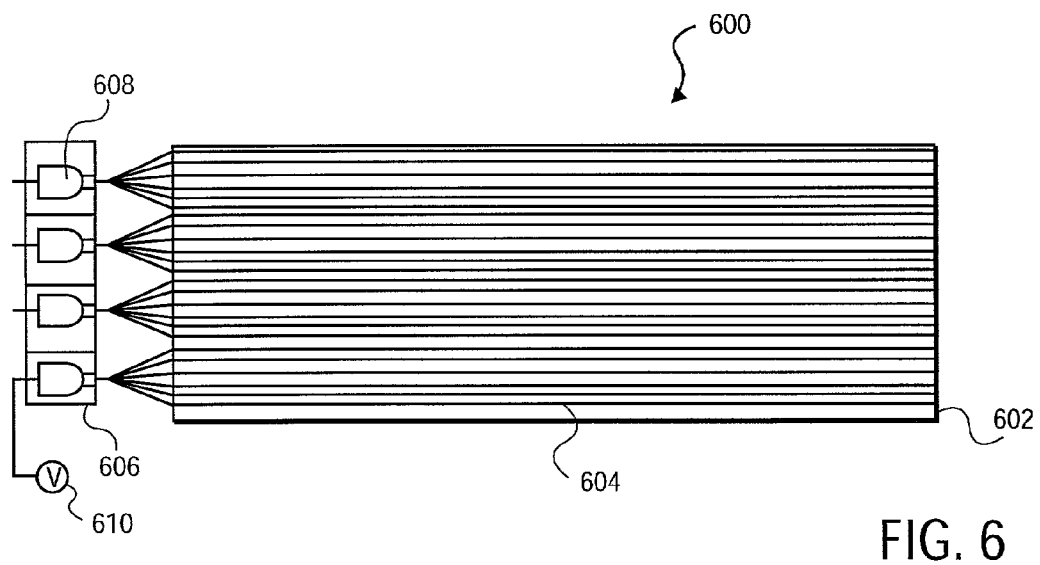
FIG. 6 illustrates an exemplary optical fiber panel that can be used to illuminate an exemplary keyboard of the present invention.

In another embodiment, the illumination panel 312 comprises of an optical fiber panel 600 as illustrated in FIG. 6. Optical fiber such as the optical fiber panel 600 is commercially available, for example, from Poly-optical, Irvine, Calif. The optical fiber panel 600 includes a plurality of optical fibers 604 adhered to a substrate 602. The substrate 602 can be made out of a flexible and reflective material such as opaque plastic or other suitable material. The optical fibers are further coupled to a light source 606 which may includes a plurality of light emitting diodes (LEDs) 608 to supply light into the optical fiber panel 600. In another example, a fluorescent lamp (much like the fluorescent lamp used to illuminate a liquid crystal display in a conventional notebook computer) is used instead of the plurality of LEDs. Additional examples of the light source 606 includes halogen lamps and metal halide lamp. The light source can be chosen based on needs for color and brightness for certain applications. A power source 610 is attached to the light source 606 to supply the necessary power to drive the LEDs 608 or other light source.

Figure 7:
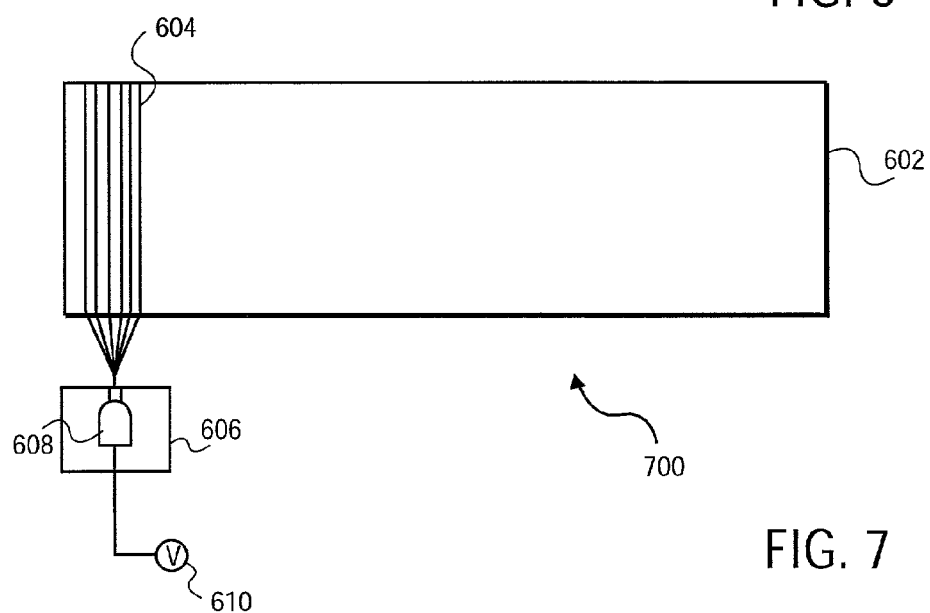
FIG. 7 illustrates another exemplary optical fiber panel that can be used to illuminate an exemplary keyboard of the present invention.

In one embodiment, optical fibers 604 are arranged horizontally and grouped as shown in FIG. 6. In another embodiment, the optical fibers 604 are arranged vertically and grouped as shown in optical fiber panel 700 in FIG. 7. In the present invention, the optical fiber panel 600 and 700 can thus be placed on the bottom of a keyboard that has the keyboard base plate 310 having a plurality of holes cutting therethrough to allow light to illuminate through to the keycap. There is no need to reconfigure the current design of the keyboard, thus, the thickness of the keyboard is minimally affected.

Figure 8A:
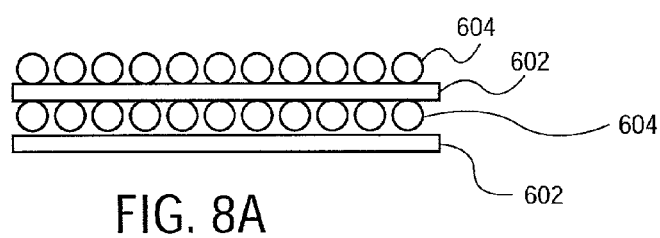
FIG. 8A illustrates an exemplary optical fiber panel that includes several layers of optical fibers; the use of several layers of the optical fiber panels increases the brightness in the illumination.

FIG. 8A illustrates in a cross-sectional view that in another embodiment, the optical fiber panel 600 includes several layers of optical fibers wherein each of the layer is constructed of a plurality of optical fibers 604 adhered to a substrate 602. Increasing the layers of optical fibers will increase the brightness of the optical fiber panel 600.

Figure 8B:
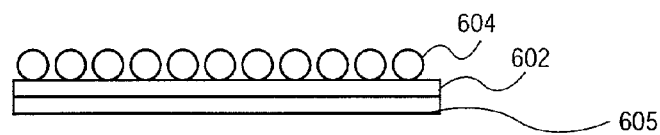
FIG. 8B illustrates an exemplary optical fiber panel that includes a reflective layer; the use of reflective layer increases the brightness in the illumination.
Figure 10:
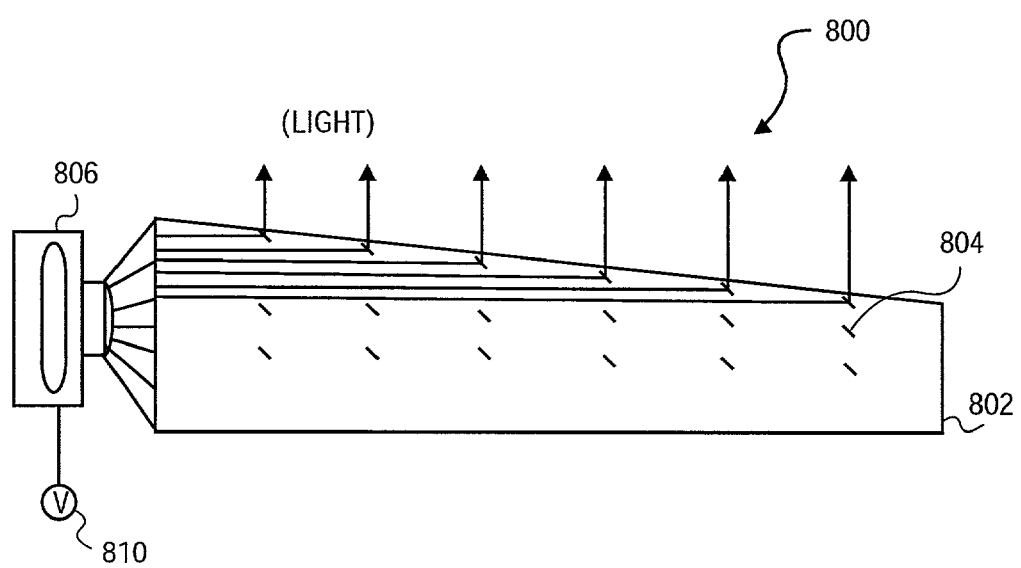
FIG. 10 illustrates an exemplary diffuser panel that can be used to illuminate an exemplary keyboard of the present invention.
Figure 11:
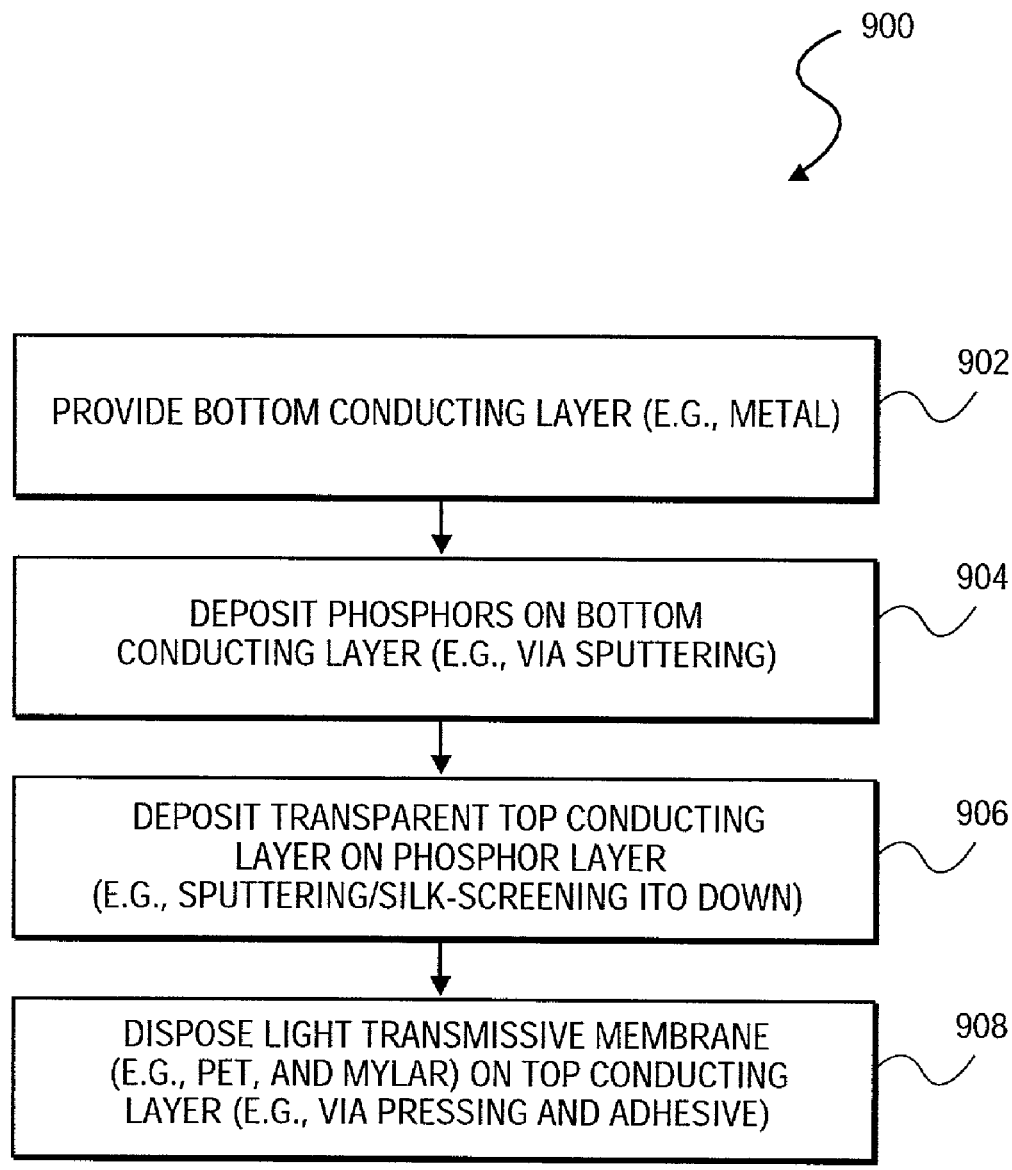
FIG. 11 illustrates an exemplary process of making an illuminated keyboard according to the present invention.

FIG. 8B illustrates in a cross-sectional view that in yet another embodiment, the optical fiber panel includes a reflective layer 605 which adheres to the substrate 602. The addition of the reflective layer 605 enhances the brightness of the optical fiber panel 600.

Figure 9:
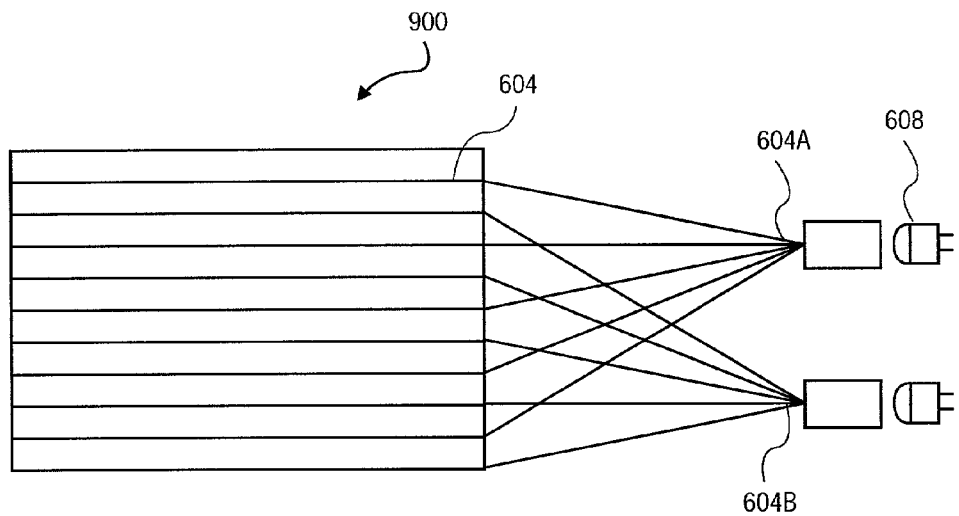
FIG. 9 illustrates an exemplary optical fiber panel, which includes a plurality of optical fiber bundles wherein the optical fibers in one optical fiber bundle interleave with the optical fibers in another optical fiber bundle.

Another way to achieve better brightness for the optical fiber panel 600 is to divide the panel into multiple sections wherein each section is illuminated by an individual light source 608 (see FIGS. 6 and 9). Although desirable, it may be difficult to obtain several light sources 608 that have exactly the same color or intensity, especially when the light source is an LED. Dividing the optical panel into multiple sections wherein each section is illuminated by a single light source may result in a difference in the color between the sections. A panel that is illuminated by two or more light sources may have two or more noticeably different color bands. FIG. 9 illustrates that in one exemplary embodiment, the optical fiber panel 600 includes two optical fiber bundles 604A and 604B. Each of the optical fiber bundle, 604A and 604B, comprises a plurality of optical fibers 604. As illustrated in this figure, the individual optical fiber 604 from each of the two optical fiber bundles 604A and 604B interleave with one another. In one example, the optical fibers 604 from each of the bundles 604A and 604B spreads evenly across the entire optical fiber panel 600. Interleaving the optical fibers 604 of the two bundles 604A and 604B together can average out any color temperature difference between the two or more light sources. Thus, the optical fiber panel 600 will have a uniform appearance.

In another embodiment, the illumination panel 312 comprises of a diffuser panel 800 as illustrated in FIG. 8. The diffuser panel 800 includes a substrate 802 having a plurality of groves 804 created into the substrate 802. The substrate 802 can be made out of a flexible and reflective material such as opaque plastic or other suitable material. The groves are created such that when the light hits the groves, it is reflected off the substrate 802 in a substantially perpendicular direction to the surface of the substrate 802. The diffuser panel 800 is further coupled to a light source 806 which may includes a plurality of LEDs like LEDs 608 to supply light into the optical fiber panel 600. Alternatively, a fluorescent lamp (much like the one used to illuminate the liquid crystal display of a conventional notebook computer) is used instead of the plurality of LEDs. A power source 810 is attached to the light source 806 to supply the necessary power to drive the light source 806.

In the present invention, the diffuser panel 800 can be placed on the bottom of a keyboard that has the keyboard base plate 310 having a plurality of holes cutting therethrough to allow light to illuminate through to the keycap. There is no need to reconfigure the current design of the keyboard, thus, the thickness of the keyboard is minimally affected.

FIG. 9 illustrates an exemplary process 900 of making the keyboard 200 as described above. Box 902 sets forth that a bottom conducting layer, for example, made out of metal, is first provided. In one instance, the bottom conducting layer has a thickness of 0.2 mm. At box 904, phosphors are deposited on the top surface of the bottom conducting layer. One exemplary method of deposition is sputtering well practiced by those skilled in the art. The sputtering condition is chosen such that a layer of phosphors having a predetermined thickness is deposited. In one example, the phosphors layer has a thickness of 0.06 mm. The phosphors layer may also include a thin dielectric layer.

Continuing with process 900, at box 906, a transparent top conducting layer is deposited on the top surface of the phosphor layer. One example of a material that can be used to make the transparent top conducting layer is ITO which can be deposited onto the phosphor layer via sputtering or silk-screening, also well practiced by those skilled in the art. The deposition condition for the ITO layer is chosen such that the ITO has a thickness of 0.04 mm.

Lastly, at box 908, a light transmissive membrane is deposited on the top surface of the transparent top conducting layer using a transparent adhesive in one example. Examples of the light transmissive membrane include polyethylene terephtalate (PET), polyethylene terephtalate glycol (PETG) and a transparent, colorless polyester sheet or film such as Mylar or Mellinex, well known in the art. The light transmissive membrane of the present example has a thickness of 0.25 mm. A plurality of input keys can then be disposed on top of the membrane using any conventional method for making a keyboard.

The method of making the keyboard 200 can be varied in several ways without deviating from the scope of the present invention.

Figure 12:
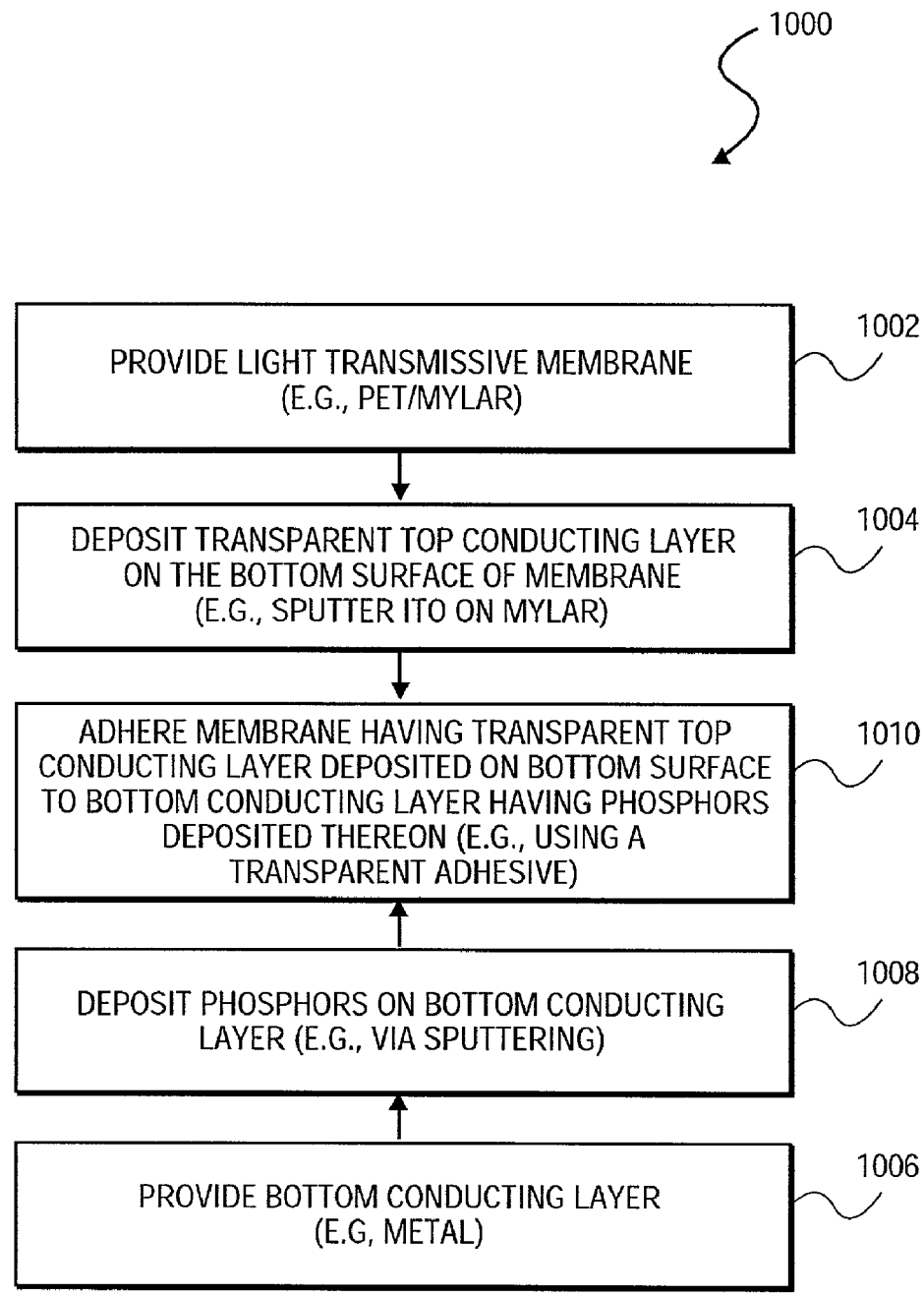
FIG. 12 illustrates another exemplary process of making an illuminated keyboard according to the present invention.

For instance, FIG. 12 illustrates another exemplary process 1000 of making the keyboard 200 as described above. Box 1002 sets forth that a light transmissive membrane having a thickness of 0.25 mm, for example, PET, PETG, or a transparent, colorless polyester sheet or film (e.g., Mylar), is first provided. At box 1004, a transparent top conducting layer (e.g., ITO) is deposited on the bottom surface of the top conducting layer. One exemplary method of deposition is sputtering well practiced by those skilled in the art. The sputtering condition is chosen such that 0.04 mm of the ITO is deposited.

Continuing with process 1000, box 1006 sets forth that in conjunction with the boxes above, a bottom conducting layer (e.g., metal) is provided. In one instance, the bottom conducting layer has a thickness of 0.2 mm. At box 1008, phosphors are deposited on the top surface of the bottom conducting layer. One exemplary method of deposition is sputtering well practiced by those skilled in the art. The sputtering condition is chosen such that a layer of phosphors having a predetermined thickness is deposited. In one example, the phosphors layer has a thickness of 0.06 mm. The phosphors layer may also include a thin dielectric layer.

Then, at box 1010, the membrane having the ITO deposited on the bottom surface and the bottom conducting layer having the phosphors deposited thereon are adhered to each other. In one example, a transparent adhesive is used to adhere the two surfaces together. The ITO is then in directly adhered to the phosphors on the bottom conducting layer. A plurality of input keys can then be disposed on top of the membrane using any conventional method for making a keyboard.

Figure 13:
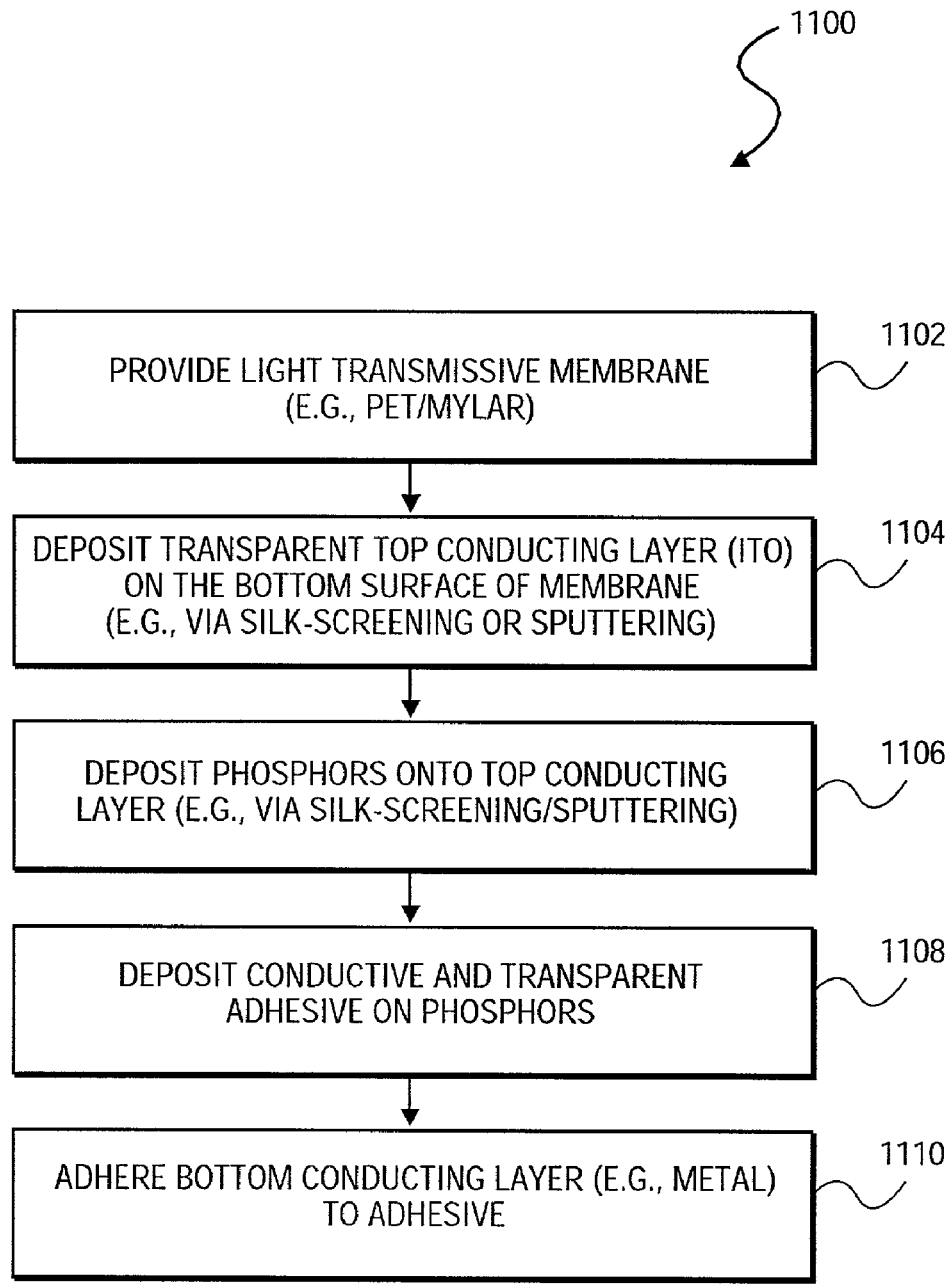
FIG. 13 illustrates yet another exemplary process of making an illuminated keyboard according to the present invention.

FIG. 13 illustrates yet another exemplary process 1100 of making the keyboard 200 as described above. Box 1102 sets forth that a light transmissive membrane having a thickness of 0.25 mm, for example, PET, PETG, or a transparent, colourless polyester sheet or film (e.g., Mylar), is first provided. At box 1104, a transparent top conducting layer (e.g., ITO) is deposited on the bottom surface of the top conducting layer. One exemplary method of deposition is sputtering well practiced by those skilled in the art. The sputtering condition is chosen such that 0.04 mm of the ITO is deposited.

Continuing with process 1100, at box 1106, phosphors are deposited on the bottom surface of the ITO layer. One exemplary method of deposition is sputtering well practiced by those skilled in the art. The sputtering condition is chosen such that a layer of phosphors having a predetermined thickness is deposited. In one example, the phosphors layer has a thickness of 0.06 mm. The phosphors layer may also include a thin dielectric layer.

At box 1108, a transparent and conductive adhesive is disposed on the phosphors. Then, at box 1110, a bottom conducting layer made out of a conductive material such as metal is disposed onto the adhesive layer. And, a plurality of input keys can then be disposed on top of the membrane using any conventional method for making a keyboard.

Figure 14:
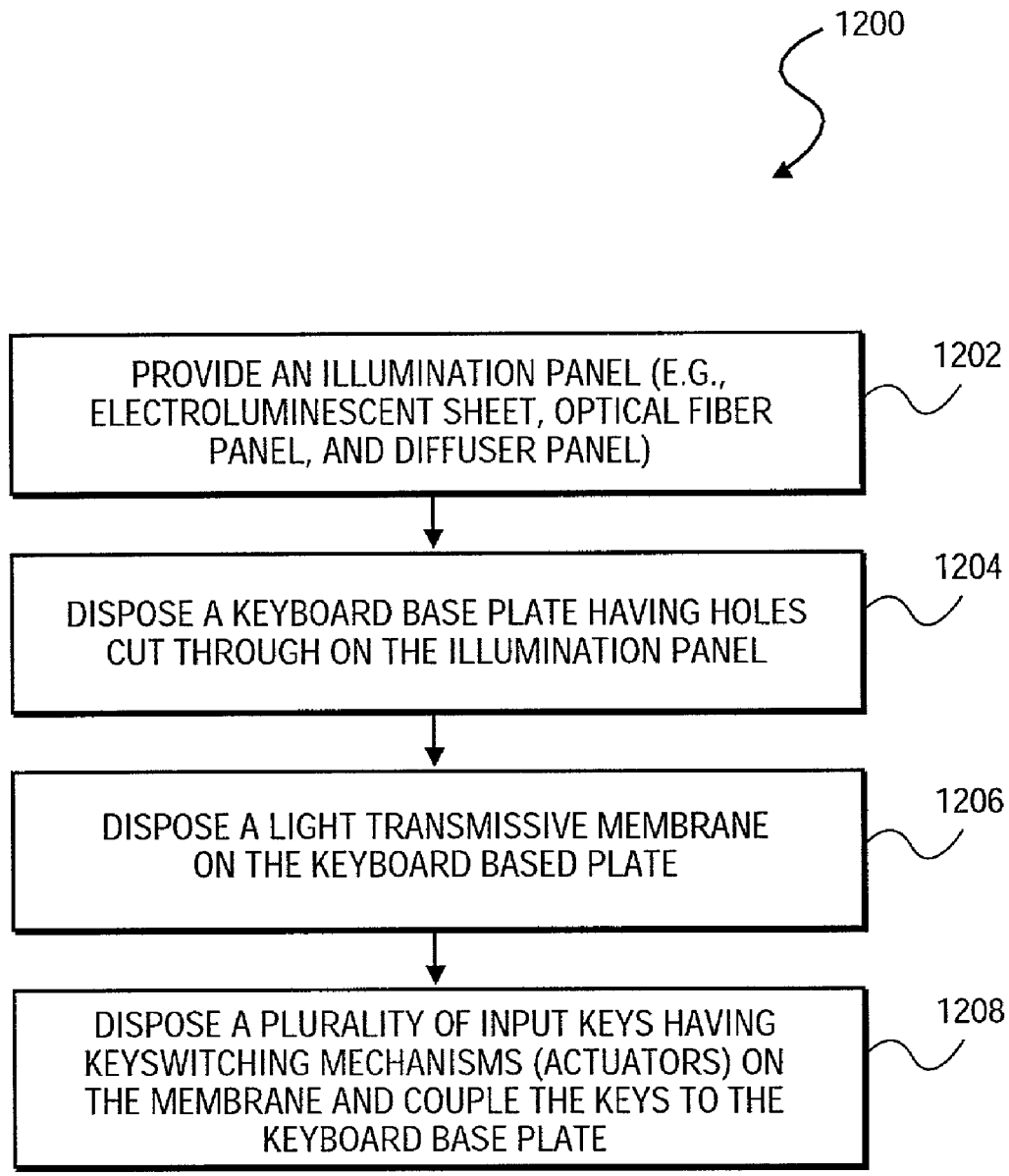
FIG. 14 illustrates further an exemplary process of making an illuminated keyboard according to the present invention.

FIG. 14 illustrates an exemplary process 1200 for making the keyboard 300 described above. At box 1202, an illumination panel is first provided. The illumination panel can be an electroluminescent sheet, an optical fiber panel, or a diffuser panel as described above. The illumination panel of the present example may have a thickness approximately about 0.20–0.50 mm in the case of the electroluminescent sheet, about 0.5–11.0 mm in the case of the diffuser panel, and about 0.20–0.40 mm in the case of the optical fiber panel. The illumination panel may optionally be supported with an additional sheet of supporting sheet described above as a stiffener support having a thickness of approximately about 0.2 mm.

At box 1204, a keyboard base plate is disposed on top of the illumination panel. At box 1206, a light transmissive keyboard membrane is disposed on the keyboard base plate. At box 1208, a plurality of input keys having keyswitch mechanisms are disposed on the light transmissive keyboard membrane and coupled to the keyboard base plate such that they extend from the keyboard base plate. The keyboard base plate may include a hole such that the keyswitch mechanism can be securely anchored into the keyboard base plate. The keyboard base plate also includes a plurality of holes cutting through. The holes match with the positions of the input keys of the keyboard such that light illuminated from the illumination panel at the bottom of the keyboard base plate will pass through the holes to the input keys.

Placing the illumination panel behind (on the bottom surface) the keyboard base plate enables the making of an illuminated keyboard without the need to modify the conventional keyboard switching mechanisms. The illuminated keyboard is thus readily adaptable to existing keyboard manufacturing process. Inserting the illumination panel in any other ways, for example, on top of the keyboard base plate, necessarily decreases the keyswitch travel. The keyswitch travel refers to the distance the key moves when pushed, with a reasonable force (typically around 120 grams), until it stops (the switch closes somewhere between the resting position and the end of travel). Moreover, a conventional electroluminescent sheet typically operates at a voltage between 80–150V and a frequency between 400–800 Hz. Placing the electroluminescent sheet behind the keyboard base plate, which is grounded, will effectively make the plate a shield between the user of the keyboard and the high voltage that drives the electroluminescent sheet.

We claim:

1. A keyboard comprising:
   a bottom conducting base plate;
   an illumination layer deposited on said bottom conducting base plate;
   a transparent top conducting layer deposited on said illumination layer;
   a light transmissive keyboard membrane disposed on said transparent top conducting layer; and
   a plurality of input keys disposed on said light transmissive keyboard membrane, each of said plurality of input keys has a keycap including an upper strike surface and attaches to a keyswitch mechanism.

2. A keyboard as in claim 1 wherein said illumination layer comprises of an electroluminescent sheet.

3. A keyboard as in claim 1 further comprising a power source configured to provide an output signal to said illumination layer to cause illuminations to said plurality of input keys.

4. A keyboard as in claim 1 wherein each of said plurality of input keys is made from a light transmissive material.

5. A keyboard as in claim 1 wherein said transparent top conducting layer is made out of indium tin oxide.

6. A keyboard as in claim 1 wherein each of said plurality of input keys includes at least one symbol.

7. A keyboard as in claim 6 wherein said at least one symbol is defined by a light transmissive portion of said upper strike surface.

8. A keyboard comprising:
   an illumination panel, said illumination panel emits light upon an application of a power source;
   a keyboard base plate disposed on top of said illumination panel, said keyboard base plate having a plurality of holes forming therethrough;
   a light transmissive keyboard membrane disposed on said keyboard base plate; and
   a plurality of input keys disposed on said light transmissive keyboard membrane and extended from said keyboard base plate, each of said plurality of input keys has a keyswitch mechanism and a keycap including an upper strike surface attached to said keyswitch mechanism, wherein said plurality of holes directing illuminations to said plurality of input keys.

9. A keyboard as in claim 8 further comprising a stiffener support disposed on a bottom surface of said illumination panel.

10. A keyboard as in claim 8 further comprising a power source configured to provide an output signal to said illumination panel to cause said illuminations.

11. A keyboard as in claim 8 wherein each of said plurality of input keys is made from a light transmissive material.

12. A keyboard as in claim 8 wherein each of said plurality of input keys includes at least one symbol.

13. A keyboard as in claim 12 wherein said at least one symbol is defined by a light transmissive portion of said upper strike surface.

14. A keyboard as in claim 8 wherein said optical fiber panel comprises of a plurality of optical fibers and wherein a light source is supplied to said optical fiber panel to cause said illuminations.

15. A keyboard as in claim 14 wherein said light source includes one of a halogen lamp, a metal halide lamp, and a light emitting diode.

16. A keyboard as in claim 8 wherein said illumination panel comprises any one of an electroluminescent lamp panel, a diffuser panel, and an optical fiber panel.

17. A keyboard as in claim 16 wherein said diffuser panel comprises of a plurality of groves that reflect lights and wherein a light source is supplied to said diffuser panel to cause said illuminations.

18. A keyboard as in claim 16 wherein said illumination panel comprises an optical fiber panel coupling to multiple light sources, said optical fiber panel comprises of a plurality of fiber bundles, each of said plurality of fiber bundles, having multiple optical fibers, is coupled to one of said multiple light sources, wherein said multiple optical fibers in one of said plurality of fiber bundles interleave with said multiple optical fibers in another one of said plurality of fiber bundles over an area of said keyboard.

19. A keyboard as in claim 18 wherein said multiple light sources include one of halogen lamps, metal halide lamps, and light emitting diodes.

20. A method of making a keyboard comprising:
depositing an illumination layer on a top surface of a bottom conducting base plate;
depositing a transparent top conducting layer on a bottom surface of a light transmissive keyboard membrane having a plurality of input keys, each of said plurality of input keys has a keycap including an upper strike surface and attaches to a keyswitch mechanism;
adhering said bottom conducting base plate to said light transmissive keyboard membrane such that said transparent top conducting layer is disposed on said illumination layer.

21. A method as in claim 20 wherein said illumination layer comprises of an electroluminescent sheet.

22. A method as in claim 20 further comprising coupling a power source to said keyboard, said power source provides an output signal to said illumination layer to cause illuminations to said plurality of input keys.

23. A method as in claim 20 wherein each of said plurality of input keys includes at least one symbol.

24. A method as in claim 20 further comprising making said at least one symbol light transmissive.

25. A method as in claim 20 further comprising making each of said plurality of input keys light transmissive.

26. A method of making a keyboard comprising:
depositing an illumination layer onto a bottom conducting base plate;
depositing a transparent top conducting layer on said illumination layer; and
depositing a light transmissive keyboard membrane on said illumination layer, said light transmissive keyboard membrane having a plurality of input keys, each of said plurality of input keys has a keycap including an upper strike surface and attaches to a keyswitch mechanism.

27. A method of making a keyboard:
disposing a keyboard base plate on an illumination panel, said illumination panel emitting light upon an application of a power source;
disposing a light transmissive keyboard membrane on said keyboard base plate wherein
said keyboard base plate has a plurality of input keys extending therefrom;
each of said plurality of input keys has a keyswitch mechanism and a keycap including an upper strike surface and attached to said keyswitch mechanism; and
said keyboard base plate having a plurality of holes forming therethrough wherein said plurality of holes directing illuminations to said plurality of input keys.

28. A method as in claim 27 further comprising disposing a stiffener support on a bottom surface of said illumination panel.

29. A method as in claim 27 further comprising coupling a power source to said keyboard, said power source configured to provide an output signal to said illumination panel to cause said illuminations.

30. A method as in claim 27 further comprising making each of said plurality of input keys light transmissive.

31. A method as in claim 27 wherein each of said plurality of input keys includes at least one symbol.

32. A method as in claim 31 further comprising making said at least one symbol light transmissive.

33. A method as in claim 27 wherein said illumination panel comprises any one of an electroluminescent lamp panel, a diffuser panel, and an optical fiber panel.

34. A method as in claim 33 further comprising including a plurality of optical fiber in said optical fiber panel and supplying a light source to said optical fiber panel to cause said illuminations.

35. A method as in claim 33 wherein said optical fiber panel comprises of a plurality of fiber bundles, each of said plurality of fiber bundles, having multiple optical fibers, is coupled to one of said multiple light sources, wherein said multiple optical fibers in one of said plurality of fiber bundles interleave with said multiple optical fibers in another one of said plurality of fiber bundles over an area of said keyboard.

36. A keyboard as in claim 35 wherein said multiple light sources include one of halogen lamps, metal halide lamps, and light emitting diodes.

37. A method as in claim 33 wherein said diffuser panel comprises of a plurality of groves that reflect lights and wherein a light source is supplied to said diffuser panel to cause said illuminations.

* * * * *